US010256361B2

(12) United States Patent
Carter et al.

(10) Patent No.: US 10,256,361 B2
(45) Date of Patent: Apr. 9, 2019

(54) MULTIPLE BAND GAP CO-NI OXIDE COMPOSITIONS AND APPLICATIONS THEREOF

(71) Applicant: THE TRUSTEES OF PRINCETON UNIVERSITY, Princeton, NJ (US)

(72) Inventors: Emily Ann Carter, Mead, NJ (US); Nima Alidoust, Princeton, NJ (US); Martina Lessio, Lawrenceville, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 1 day.

(21) Appl. No.: 15/250,633

(22) Filed: Aug. 29, 2016

(65) Prior Publication Data

US 2017/0062641 A1 Mar. 2, 2017

Related U.S. Application Data

(60) Provisional application No. 62/210,761, filed on Aug. 27, 2015.

(51) Int. Cl.
*H01L 31/0687* (2012.01)
*H01L 33/26* (2010.01)
*C01G 53/00* (2006.01)
*H01L 31/032* (2006.01)

(52) U.S. Cl.
CPC ......... *H01L 31/0687* (2013.01); *C01G 53/40* (2013.01); *H01L 31/032* (2013.01); *H01L 33/26* (2013.01); *C01P 2002/52* (2013.01); *C01P 2002/77* (2013.01)

(58) Field of Classification Search
CPC ... H01L 31/0687; H01L 31/032; H01L 33/26; C01G 53/40; C01P 2002/52; C01P 2002/07
See application file for complete search history.

(56) References Cited

U.S. PATENT DOCUMENTS

| 6,939,731 | B2* | 9/2005 | Ishizaki | C23C 16/40 |
| | | | | 257/E21.463 |
| 9,112,074 | B2* | 8/2015 | Boutwell | H01L 31/032 |
| 10,056,507 | B2* | 8/2018 | Shao | H01L 31/022466 |
| 2002/0132142 | A1* | 9/2002 | Windisch, Jr. | C03C 17/245 |
| | | | | 428/701 |
| 2010/0237344 | A1* | 9/2010 | Schoenfeld | H01L 31/032 |
| | | | | 257/43 |

OTHER PUBLICATIONS

Licht et al., Multiple-Bandgap Photoelectrochemistry: Bipolar Semiconductor Ohmic Regenerative Electrochemistry, J. Phys. Chem. B 1998, 102, 2536-2545.*
Men et al., Design of photonic crystals with multiple and combined band gaps, Physical Review E 83, 046703 (2011).*

* cited by examiner

*Primary Examiner* — Golam Mowla
(74) *Attorney, Agent, or Firm* — J. Clinton Wimbish; Nexsen Pruet, PLLC

(57) ABSTRACT

In one aspect, metal oxide compositions having electronic structure of multiple band gaps are described. In some embodiments, a metal oxide composition comprises a (Co,Ni)O alloy having electronic structure including multiple band gaps. The (Co,Ni)O alloy can include a first band gap and a second band gap, the first band gap separating valence and conduction bands of the electronic structure.

24 Claims, 5 Drawing Sheets

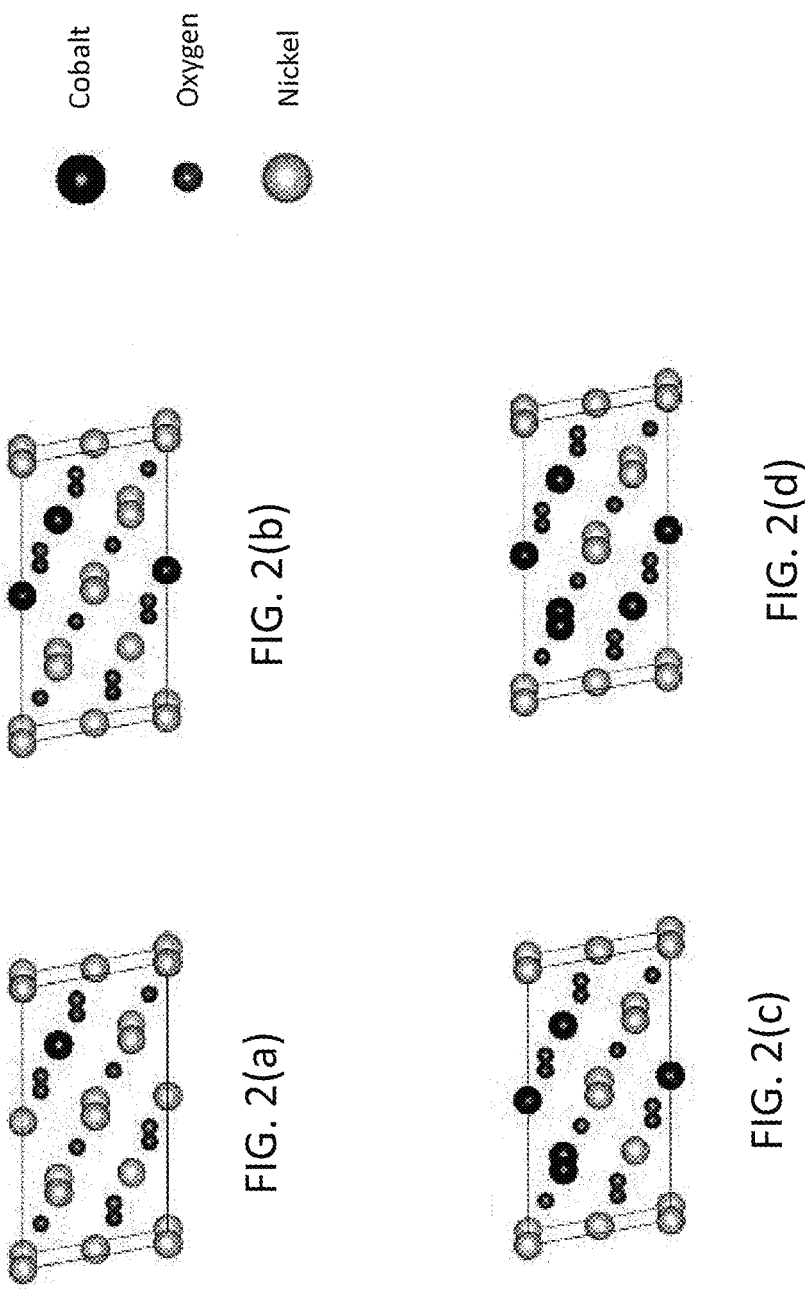

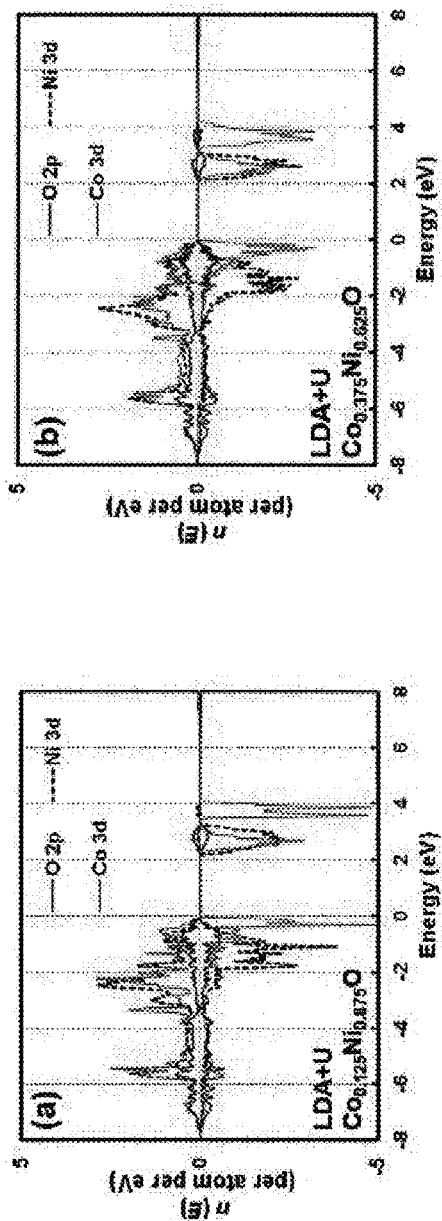
FIG. 4(a)
FIG. 4(b)
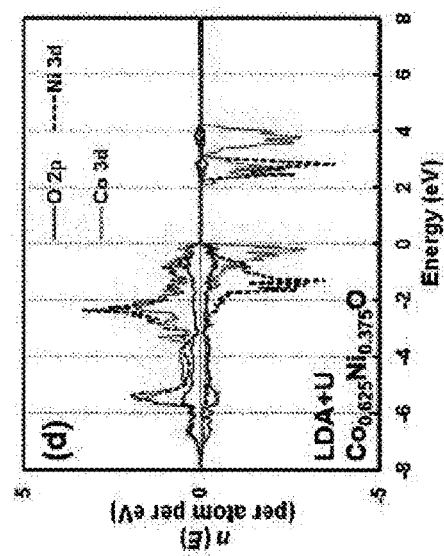
FIG. 4(c)
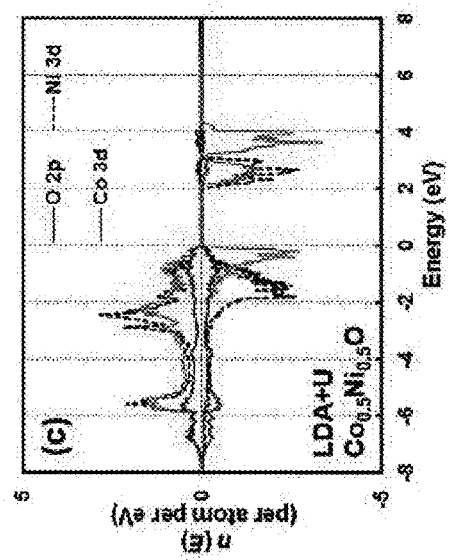
FIG. 4(d)

MULTIPLE BAND GAP CO-NI OXIDE COMPOSITIONS AND APPLICATIONS THEREOF

RELATED APPLICATION DATA

The present application claims priority pursuant to 35 U.S.C. § 119(e)(1) to United States Provisional Patent Application Ser. No. 62/210,761 filed Aug. 27, 2015 which is incorporated herein by reference in its entirety.

STATEMENT OF GOVERNMENT RIGHTS

This invention was made with government support under Grant No. DE-SC0002120 awarded by the Department of Energy. The government has certain rights in the invention.

FIELD

The present invention relates to metal oxide compositions and, in particular, to metal oxide compositions having electronic structure including multiple bandgaps.

BACKGROUND

Conventional solar cells have made significant progress in the past few decades. These solar cells rely on a semiconductor with a single band gap to absorb sunlight as illustrated in FIG. 1(a). The absorbed photons in turn excite electrons across the band gap, creating an electron-hole pair. Typically, the built-in electric field in a pn junction separates this electron and hole, which will enter an external circuit to power an electric device. The most widespread conventional solar cells use inorganic semiconductors such as Si, CdTe, and GaAs as the light-absorbing semiconductor. Devices based on these semiconductors have reached efficiencies as high as 28%. A new semiconductor, methylammonium lead iodide ($CH_3NH_3PbI_3$), has attracted significant attention recently by achieving efficiencies as high as 20%, up from 4% within only about four years. Both light absorption and charge separation typically occur within the semiconductor in Si-, CdTe-, GaAs-, and $CH_3NH_3PbI_3$-based devices.

However, another class of photovoltaic (PV) cells utilize organic materials for light absorption, while a wide-gap semiconductor is used to transport photo-excited carriers away from the absorption site. The advantage of organic PVs is the fact that organic materials are generally cheaper, more flexible and more tunable than their inorganic counterparts. Nevertheless, their efficiencies are usually lower (reaching only ~12%) due to low charge carrier mobilities associated with organic materials. Regardless of whether inorganic or organic materials are used, they share common challenges associated with conventional solar cells: how to decrease materials processing and cell fabrication costs, increase light absorption, increase the energy collected per carrier, and improve the collection efficiency of the photo-excited carriers. And then, even if all of these challenges are resolved, the highest power conversion efficiencies that these conventional devices can reach is only ~34%.

The efficiency of current PV technologies is approaching the Shockley-Queisser limit. This remarkable increase in efficiency has been the result of advances in materials processing, improving interfaces, coming up with innovative ways to decrease electron-hole recombination, and increasing light absorption. However, the scalability of PV technologies will be limited after reaching this theoretical efficiency. At that point, the only way one can improve the viability of conventional PV utilization would be by cutting costs. This important limitation has led to a search for alternative conceptual frameworks that could yield technologies that defy this theoretical limit.

One promising direction for going beyond the Shockley-Queisser limit is to use multi-junction or tandem solar cells as illustrated in FIG. 1(b). Tandem solar cells stack a number of different solar cells with semiconductors of different band gap on top of each other. The cells with the highest band-gap semiconductors are usually on top, i.e., the side that faces the sunlight. This design ensures that the low-energy light which remains unabsorbed by the uppermost cells can be absorbed by the lower-lying cells with lower band gaps. Of course, the Shockley-Queisser limit is still relevant for individual cells in this design. However, combining all of these cells together leads to a dramatic increase in light absorption without sacrificing the energy per carrier associated with the higher energy photo-generated carriers. Tandem solar cells can ideally reach efficiencies twice as high as those of singlejunction, single-gap solar cells. In fact, currently, efficiencies higher than 40% have been achieved in triple-junction, tandem solar cells that utilize band gap engineering of III-V semiconductors. Despite the tremendous promise, tandem solar cells are still very costly to fabricate and are therefore not viable for widespread commercial use.

Another idea for going beyond the Shockley-Queisser limit is to use intermediate band semiconductors (IBSCs) in single-junction solar cells. IBSCs differ from typical semiconductors in that there exists a narrow, partially filled intermediate band within the gap that separates their valence band edge (VBE) and conduction band edge (CBE) as illustrated in FIG. 1(c). In essence, the electronic structure of these materials contains two forbidden gaps, $E^1_g$ and $E^2_g$. $E^1_g$ separates the VBE from the intermediate band, while $E^2_g$ is the gap between the intermediate band and the CBE. The presence of the intermediate band leads to sub-band-gap light absorption across $E^1_g$ and $E^2_g$ in addition to the absorption that would have regardless occurred across the overall band gap $E^{tot}_g$.

Conceptually, an IBSC-based solar cell is equivalent to two cells (with $E^1_g$ and $E^2_g$ band gaps) that are connected in series, together with one cell (with band gap $E^{tot}_g$) that is connected to the other two in parallel. The enhanced light absorption together with the ability to sustain higher Voc increases the theoretical efficiency of a single-junction solar cell based on IBSCs to as high as ~65%, which would correspond to an optimal $E^{tot}_g$ of ~2 eV, with two sub-band-gaps of 1.2 eV and 0.7 eV. Even at $E^{tot}_g$ values higher than 3 eV, efficiencies as high as 55% can theoretically be achieved. This remarkable potential for achieving high efficiencies makes IBSCs a promising class of materials for solar energy conversion. However, only a limited number of IBSC materials currently exist and manufacture of such materials is cost prohibitive for commercial applications.

SUMMARY

In view of these limitations and disadvantages, metal oxide compositions are described herein exhibiting electronic structure including multiple band gaps. In particular, a metal oxide composition comprising a (Co,Ni)O alloy has been discovered to exhibit an electronic structure containing multiple band gaps in the visible light range. The (Co,Ni)O alloy includes a first band gap and a second band gap, the first band gap separating valence and conduction bands of the electronic structure.

In another aspect, methods of making (Co,Ni)O compositions are described herein. In some embodiments, a method comprises alloying nickel (II) oxide with cobalt (II) oxide in an amount inducing multiple band gaps in the (Co,Ni)O electronic structure. In further aspects, apparatus employing multi-band gap (Co,Ni)O compositions are provided. In some embodiments, a photovoltaic apparatus comprises a photosensitive region, the photosensitive region comprising a (Co,Ni)O alloy having electronic structure including multiple band gaps for absorption of multiple photons. In other embodiments, a light emitting diode comprises a (Co,Ni)O alloy having electronic structure including multiple band gaps for multi-color emission.

These and other embodiments are described further in the following detailed description.

BRIEF DESCRIPTION OF THE DRAWINGS

FIG. 2(a) illustrates a unit cell for a $Co_{0.125}Ni_{0.875}O$ alloy.
FIG. 2(b) illustrates a unit cell for a $Co_{0.25}Ni_{0.75}O$ alloy.
FIG. 2(c) illustrates a unit cell for a $Co_{0.375}Ni_{0.625}O$ alloy.
FIG. 2(d) illustrates a unit cell for a $Co_{0.5}Ni_{0.5}O$ alloy.

FIG. 4(a) illustrates electronic structure of a $Co_{0.125}Ni_{0.875}O$ alloy according to LDA+U.

FIG. 4(b) illustrates electronic structure of a $Co_{0.375}Ni_{0.625}O$ alloy according to LDA+U.

FIG. 4(c) illustrates electronic structure of a $Co_{0.5}Ni_{0.5}O$ alloy according to LDA+U.

FIG. 4(d) illustrates electronic structure of a $Co_{0.625}Ni_{0.375}O$ alloy according to LDA+U.

DETAILED DESCRIPTION

Figure 1C:
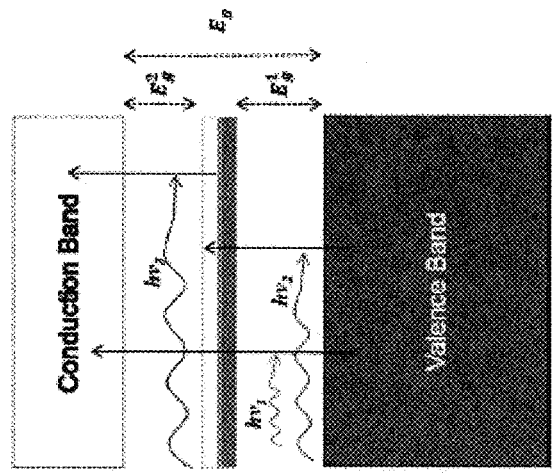
FIG. 1(c) illustrates light absorption across the band gaps of an intermediate band gap semiconductor.
Figure 1B:
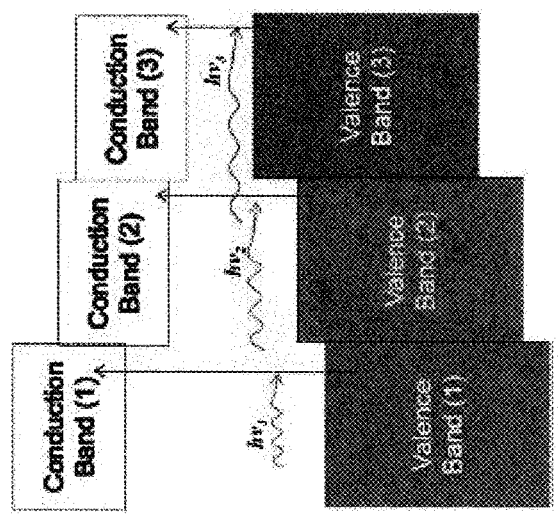
FIG. 1(b) illustrates light absorption across the band gaps of a multi-junction, tandem solar cell.
Figure 1A:
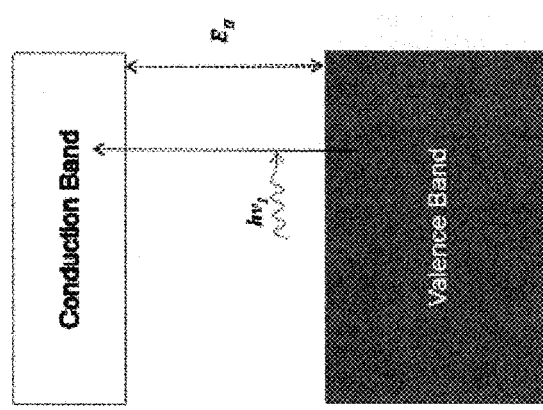
FIG. 1(a) illustrates light absorption across the band gap of a single junction semiconductor.

Embodiments described herein can be understood more readily by reference to the following detailed description, examples and drawings. Elements, apparatus, and methods described herein, however, are not limited to the specific embodiments presented in the detailed description, examples and drawings. It should be recognized that these embodiments are merely illustrative of the principles of the present invention. Numerous modifications and adaptations will be readily apparent to those of skill in the art without departing from the spirit and scope of the invention.

In one aspect, metal oxide compositions having electronic structure including multiple band gaps are described. In some embodiments, a metal oxide composition comprises a (Co,Ni)O alloy having electronic structure including multiple band gaps. The (Co,Ni)O alloy can include a first band gap and a second band gap, the first band gap separating valence and conduction bands of the electronic structure. By exhibiting two band gaps, the (Co,Ni)O alloy comprises two bands in its conduction band. As detailed further herein, the first band or intermediate band resides closer the to the valence band. The second band of the conduction band resides at higher energy. In some embodiments, the first band is separated from the second band by at least 0.2 eV. The first and second bands of the conduction band, for example, can be separated by 0.2-0.7 eV. Moreover, the first band can have a width of at least 0.8 eV, such as 0.8-1.5 eV. The second band of the conduction band can have a width of at least 0.4 eV, such as 0.5-1.0 eV.

Importantly, Co and Ni can be present in the (Co,Ni)O alloy in any amount resulting in electronic structure including multiple band gaps. In some embodiments, the (Co,Ni)O alloy is of the formula $Co_xNi_{1-x}O$ wherein $0.2 \leq x \leq 0.3$. In alternative embodiments, the value for x can be selected from Table I.

TABLE I

| Value for x in $(Co_xNi_{1-x})O$ |
|---|
| 0.125 < x < 0.375 |
| 0.18 ≤ x ≤ 0.35 |
| 0.22 ≤ x ≤ 0.28 |
| 0.23 ≤ x ≤ 0.27 |
| x = 0.25 |

The multiple band gap electronic structure of the (Co,Ni)O alloy can permit the absorption of multiple photons in comparison to a single band gap electronic structure. Similarly, the multiple band gap electronic structure can provide the (Co,Ni)O alloy a multi-color emission profile.

Cubic NiO and CoO are stable oxides of Ni and Co, respectively. Additionally, the ionic radii of $Ni^{2+}$ and $Co^{2+}$ deviate only ~6%, thereby facilitating cubic solid solutions of $Co_xNi_{1-x}$ at various concentrations, including the concentrations of Table I. Benchmark electronic structure calculations have identified the appropriate exchange-correlation description for treating the ground-state structure of (Co,Ni)O compositions to be the local density approximation (LDA) within LDA+U theory where U–J=4.0 eV for $Co^{2+}$ (optimized for $Co^{3+}$ in $Co_3O_4$) and U–J=3.8 eV for $Ni^{2+}$ (optimized for $Ni^{2+}$ in NiO). The optimal value for $Co^{2+}$ is expected to differ somewhat from $Co^{3+}$, given the different oxidation states. However, previous calculations on $Fe^{2+}$ and $Fe^{3+}$ indicate this difference is only ~0.5 eV for the similar transition metal Fe, which is comparable to the typical convergence threshold of ~0.5 eV for calculation of U–J. Electronic structures of various (Co,Ni)O compositions were also elucidated via LDA+U/$G_0W_0$ calculations. It has been shown that LDA+U/$G_0W_0$ theory achieved excellent agreement with experiments when it comes to the quasiparticle (QP) gap and the electronic structure of pure NiO. The spin-polarized projector augmented wave potentials used for Ni and Co ions accounted for the 1s2s2p3s3p electrons within a frozen core approximation. Various Co concentrations in the $Co_xNi_{1-x}O$ alloys were modeled using special quasi-random structure (SQS) cells for the cases of provided in Table II.

TABLE II

| Modeled $Co_xNi_{1-x}O$ alloys | |
|---|---|
| $Co_xNi_{1-x}O$ alloy | FIG. |
| $Co_{0.125}Ni_{0.875}O$ | 2(a) |
| $Co_{0.25}Ni_{0.75}O$ | 2(b) |
| $Co_{0.375}Ni_{0.625}O$ | 2(c) |
| $Co_{0.5}Ni_{0.5}O$ | 2(d) |
| $Co_{0.625}Ni_{0.375}O$ | — |

TABLE II-continued

Modeled $Co_xNi_{1-x}O$ alloys

| $Co_xNi_{1-x}O$ alloy | FIG. |
|---|---|
| $Co_{0.75}Ni_{0.25}O$ | — |
| $Co_{0.875}Ni_{0.175}O$ | — |

Unit cells for several of the modeled alloys are provided in FIGS. 2(a)-2(d). The unit cells for $Co_{0.625}Ni_{0.375}O$, $Co_{0.75}Ni_{0.25}O$ and $Co_{0.875}Ni_{0.175}O$ are identical to FIGS. 2(a)-2(c) with Ni sites replacing Co sites and vice versa.

The cell with 0.125 Co (Ni) concentration was constructed by replacing one Ni (Co) ion with a Co (Ni) ion in the 0.25 (0.75) SQS cell. For the case with 0.375 Co (Ni) concentration, a Co (Ni) ion was replaced from the 0.5 Co (Ni) concentration SQS cell with a Ni (Co) ion. For cases with higher Ni (Co) concentration, geometry relaxation from unit cells was initiated with the lattice constant 4.180 Angstroms, corresponding to the experimental lattice constant of NiO (CoO). For the case with 0.5 Co and Ni concentrations, relaxation was started from a cell with a lattice constant of 4.21 Angstroms, which lies between the lattice constants of the two transition metal oxides. Given the absence of experimental studies on the magnetism of NiO—CoO alloys, it was assumed that the AFM coupling between transition-metal ions in pure NiO and CoO is preserved upon alloying to form $Co_xNi_{1-x}O$ alloys.

The LDA+U calculations employed a 6×10×4 Γ-point-centered k-point mesh, 128 bands, and 700 eV kinetic energy cutoff for the plane-wave basis set. Considering the k-point sampling in a certain direction should be inversely proportional to the lattice parameter in that direction, the k-point sampling in each direction was consistent with that of pure CoO and denser than sampling implied by pure NiO, thereby providing greater accuracy. The total energy per atom was converged to within 1 meV with these parameters. The LDA+U/$G_0W_0$ calculations used a 4×8×2 Γ-point-centered k-point mesh, 128 bands (half of them empty) and 96 frequency points for evaluation of the response function. The QP gap was converged to within 0.1 eV with these parameters.

Figure 3B:
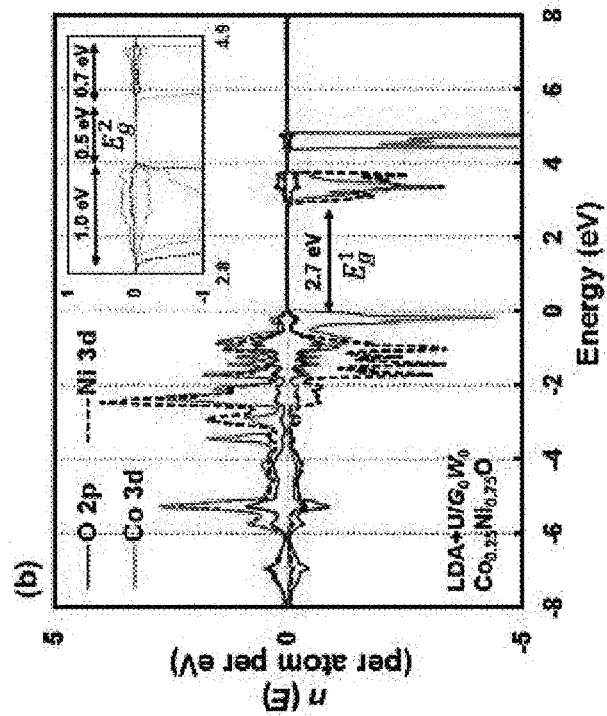
FIGS. 3(a) and 3(b) illustrate the multiple band gap structure of a $Co_{0.25}Ni_{0.75}O$ alloy according to LDA+U and LDA+U/$G_0W_0$ calculations, respectively.
Figure 3A:
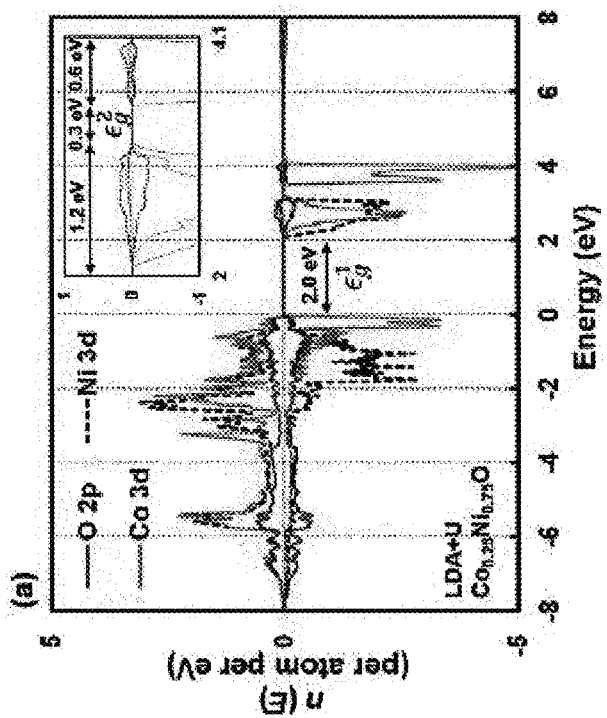
Figure 4F:
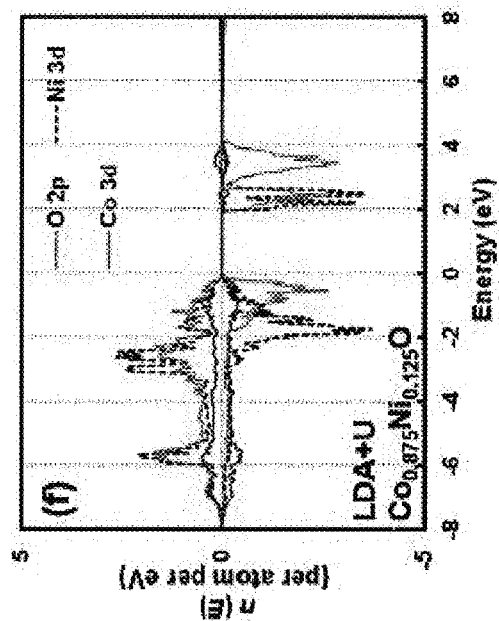
FIG. 4(f) illustrates electronic structure of a $Co_{0.875}Ni_{0.125}O$ alloy according to LDA+U.
Figure 4E:
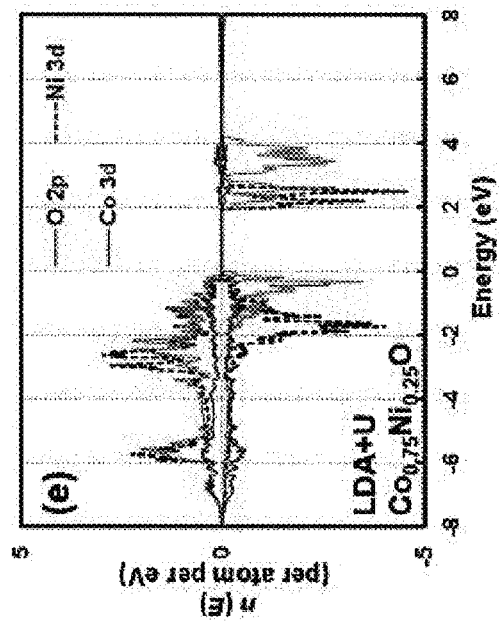
FIG. 4(e) illustrates electronic structure of a $Co_{0.75}Ni_{0.25}O$ alloy according to LDA+U.

FIGS. 3(a) and 3(b) illustrate the multiple band gap ($E^1_g$, $E^2_g$) structure of the $Co_{0.25}Ni_{0.75}O$ alloy. As illustrated in FIGS. 3(a) and 3(b), the conduction band comprises a first or intermediate band and a second band. The first band has a width of 1-1.2 eV and the second band has a width of 0.6-0.7 eV, depending on modeling employed. Moreover, the first and second bands are separated by 0.3-0.5 eV. This is in contrast to FIGS. 4(a)-4(f), where none of the (Co,Ni)O alloys exhibited a multiple band gap electronic structure. This is not to say that other $Co_xNi_{1-x}O$ alloy compositions unexamined in the present analysis fail to exhibit an electronic structure having multiple band gaps. When it comes to geometric structure, the lattice constant of the $Co_{0.25}Ni_{0.75}O$ alloy is 4.083 Angstroms, comparable with that of NiO at 4.180 Angstroms. A closer inspection of the conduction band of this alloy shows that the intermediate band (i.e., the lower energy peak in the conduction band is a hybrid of partially empty Ni 3d ($e_g$) and Co 3d ($t_{2g}$) orbitals. Remarkably, the Ni 3d ($e_g$) orbitals do not hybridize with the Co 3d ($e_g$) orbitals, with which they share the same symmetry.

This likely stems from the fact that the work function of pure CoO is ~1 eV lower than that of pure NiO. The difference between the work functions (or equivalently the band gap center in undoped semiconductors) can lead to a reduction in the band gap upon alloying if the band gaps of the parent oxides are comparable in magnitude. However, the band gap of CoO is also ~1 eV lower than that of NiO. This means that in an alloy composed of the two oxides, the Ni 3d ($e_g$) states, which are prevalent in NiO's conduction band edge (CBE), would be aligned with the Co 3d ($t_{2g}$), which make up CoO's CBE. Therefore, the CBE of the alloy consists of states that are a hybrid of these two sets of states. In contrast, since the valence band edge (VBE) of NiO lies at lower energies compared with that of CoO, hybridization at the VBE is not significant for the alloys of these two materials.

Similar to pure CoO and unlike pure NiO, the $Co_{0.25}Ni_{0.75}O$ alloy does not show significant ligand-to-metal CT character. The VBE associated with $Co_{0.25}Ni_{0.75}O$ has a prominent Co d character, while its CBE comprises both Ni d and Co d states (FIGS. 3(a) and 3(b)). Therefore, although no improvements to the electron-hole pair lifetime due to ligand-to-metal CT character could be expected, the possibility of metal-to-metal CT character (from Co d states at the VBE to Ni d states at the CBE of the intermediate band) could still lead to an increase in carrier lifetimes.

The ground-state LDA+U electronic structure of $Co_{0.25}Ni_{0.75}O$ indicates that the width of the first or intermediate band associated with this alloy (1.2 eV) is larger than that in CoO (0.5 eV) by 0.7 eV, thereby indicating this alloy has the potential to achieve the important goal of increasing the width of the first or intermediate band. However, the actual extent of this widening should be assessed by LDA+U/$G_0W_0$ theory. LDA+U/$G_0W_0$ calculations on $Co_{0.25}Ni_{0.75}O$ show that the QP corrections do not alter the double-gap structure associated with this alloy (FIG. 3(b)). The QP gap of this alloy is predicted to be ~2.7 eV, which is comparable to that of pure CoO. The LDA+U/$G_0W_0$ character of the band edges and their relative prominence do not differ significantly from the ground-state electronic structure given by LDA+U (FIG. 3(a)). However, similar to the LDA+U case, the width of the intermediate band is ~0.7 eV larger than that of pure CoO, while the upper band gap $E^2g$ has the same magnitude as that in pure CoO. $Co_{0.25}Ni_{0.75}O$ has a much wider intermediate band than that of pure CoO and, therefore, it is more suitable for use as a potential parent material in IBSC-based in photovoltaics. By engineering proper heterojunctions and with appropriate doping, this material also has the potential for uses in LEDs and lasers.

In some embodiments, for example, (Co,Ni)O compositions can be doped to exhibit p-type character or n-type character, while preserving the multiple band gap electronic structure. (Co,Ni)O compositions can doped with one more alkali metals, alkaline earth metals, transition metals and/or Lanthanide series metals. In some embodiments, a dopant comprises lithium, sodium or magnesium. Suitable dopants can also be selected from Groups IIB-VIA of the Periodic Table. Doping of the (Co,Ni)O composition can provide the desired heterojunction architecture for employment of the (Co,Ni)O composition in photovoltaic devices and/or light emitting diodes.

(Co,Ni)O compositions can generally be fabricated by substitutionally alloying nickel (II) oxide with Co in an amount inducing multiple band gaps in the (Co,Ni)O electronic structure. In some embodiments, (Co,Ni)O compositions can be fabricated by pulsed laser deposition (PLD), atomic layer deposition (ALD), atomic layer epitaxy (ALE) or molecular beam epitaxy (MBE). [See, e.g. Irwin et al., PNAS, Vol. 105, No. 8, pp. 2783-2787]. Colloidal synthesis techniques can also be used for creating nano-structured transition-metal oxide alloys [See, e.g. Radovanovic et al., *J. Am. Chem. Soc.*, 2002, 124 (51), pp 15192-15193]. In some embodiments, one or more additional transition metal oxides may serve as alloying partner(s) with cobalt oxide and nickel oxide in the fabrication process as well.

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A metal oxide composition comprising:
a (Co,Ni)O alloy having electronic structure including multiple band gaps, wherein Co and Ni are each in the $2^+$ oxidation state.

2. The metal oxide composition of claim 1, wherein the (Co,Ni)O alloy includes a first band gap and a second band gap, the first band gap separating valence and conduction bands of the electronic structure.

3. The metal oxide composition of claim 2, wherein the conduction band comprises a first band and a second band.

4. The metal oxide composition of claim 3, wherein the first band and the second band are separated by at least 0.2 eV.

5. The metal oxide composition of claim 3, wherein the first band and the second band are separated by 0.2-0.7 eV.

6. The metal oxide composition of claim 3, wherein the first band has a width of at least 0.8 eV.

7. The metal oxide composition of claim 3, wherein the first band has a width of 0.8-1.5 eV.

8. The metal oxide composition of claim 3, wherein the second band has a width of at least 0.4 eV.

9. The metal oxide composition of claim 3, wherein the second band has a width of 0.5-1.0 eV.

10. The metal oxide composition of claim 1, wherein the (Co,Ni)O alloy is of the formula $Co_xNi_{1-x}O$ with $0.2 \leq x \leq 0.3$.

11. The metal oxide composition of claim 10, wherein $0.23 \leq x \leq 0.27$.

12. The metal oxide composition of claim 10, wherein $x=0.25$.

13. The metal oxide composition of claim 1, wherein the (Co,Ni)O alloy is of the formula $Co_xNi_{1-x}O$ with $0.125 < x < 0.375$.

14. The metal oxide composition of claim 1, wherein the (Co,Ni)O alloy comprises one or more dopants.

15. The metal oxide composition of claim 14, wherein the doped (Co,Ni)O alloy exhibits p-type character.

16. The metal oxide composition of claim 14, wherein the doped (Co,Ni)O alloy exhibits n-type character.

17. The metal oxide composition of claim 14, wherein the one or more dopants are selected from the group consisting of alkali metals, alkaline earth metals, transition metals and Lanthanide series metals.

18. The metal oxide composition of claim 1 having photonic emission of varying wavelengths.

19. A solar cell comprising:
a photosensitive region, the photosensitive region comprising a (Co,Ni)O alloy having electronic structure including multiple band gaps, wherein Co and Ni are each in the $2^+$ oxidation state.

20. A light emitting diode comprising:
a light emitting region, the light emitting region comprising a (Co,Ni)O alloy having electronic structure including multiple band gaps, wherein Co and Ni are each in the $2^+$ oxidation state.

21. The metal oxide composition of claim 1, wherein the (Co,Ni)O alloy has cubic crystalline structure.

22. The solar cell of claim 19, wherein the (Co,Ni)O alloy has cubic crystalline structure.

23. The light emitting diode of claim 20, wherein the (Co,Ni)O alloy has cubic crystalline structure.

24. A metal oxide composition comprising:
a (Co,Ni)O alloy having electronic structure including multiple band gaps, wherein the (Co,Ni)O alloy has cubic crystalline structure.

* * * * *